OSCILLATOR CIRCUIT INCLUDING PULSED SUPPRESSION

Filed Oct. 31, 1962

INVENTORS:
WILLIAM C. BATES,
THOMAS T. TRUE,
BY Frank J. Thompson
THEIR ATTORNEY.

United States Patent Office 3,253,236 Patented May 24, 1966

3,253,236
OSCILLATOR CIRCUIT INCLUDING PULSED SUPPRESSION

William C. Bates, Clay, and Thomas T. True, Camillus, N.Y., assignors to General Electric Company, a corporation of New York Filed Oct. 31, 1962, Ser. No. 234,418
4 Claims. (Cl. 331—172)

Figure 1:
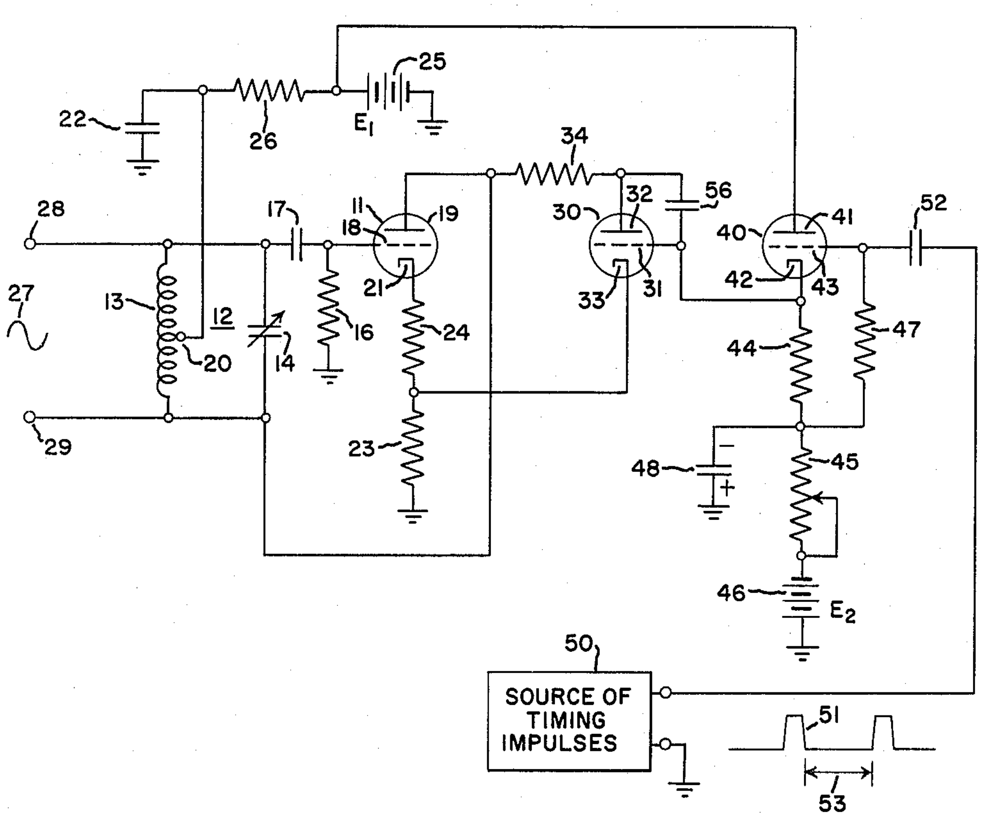

This invention relates to sine wave oscillator circuit arrangements having means for suppressing generated oscillations for the duration of an input timing pulse. The present invention relates more particularly to a circuit arrangement having means for providing relatively rapid initiation and termination of the suppression.

In certain electrical apparatus utilizing sinusoidal oscillator circuits, it is necessary that an electrical oscillation which is generated thereby be automatically suppressed for a desired period of time. For example, one apparatus having this requirement is a color television projection apparatus of the type described in Patent No. 2,813,146, which is assigned to the assignee of the present invention. In order to provide proper color rendition in this apparatus, a generated sinusoidal voltage which velocity modulates a scanning electron beam must be phase coherent at the beginning of successive horizontal scanning lines. Phase coherence is provided by suppressing generated oscillations during a retrace interval. In providing phase coherence, it is desirable to rapidly initiate and terminate suppression of this sinusoidal voltage.

A sinusoidal oscillator circuit arrangement is known for suppressing a generated waveform in response to an electrical pulse. This arrangement includes a device coupled to a tuned circuit of the oscillator in a manner for damping the tuned circuit during the occurrence of the electrical pulse. Although this arrangement provides adequate initiation and termination of suppression in many instances, it does not provide the desired rapid initiation and termination of suppression as required by the referred-to color television projection apparatus.

Accordingly, it is an object of this invention to provide a sinusoidal oscillator circuit arrangement having improved means for suppressing a generated waveform in response to an electrical pulse.

Another object of this invention is to provide a sinusoidal oscillator circuit arrangement having means for rapidly initiating and terminating the suppression of a generated waveform in response to an electrical pulse.

In accordance with the present invention, a sinusoidal oscillator circuit arrangement is provided including an oscillator circuit having an oscillation frequency determining tuned circuit, a first amplifying device, and a degeneration impedance coupled to a control electrode of the amplifying device. A second amplifying device having first and second output electrodes and a control electrode is provide. Means provide and couple an electrical timing pulse to the control electrode of the second amplifying device. The output electrodes of the second amplifying device are direct current coupled to the oscillator circuit in a manner for simultaneously developing a direct current degeneration voltage across the resistive impedance in the oscillator circuit and for damping the tuned circuit during occurrence of the electrical pulse. Means are also provided for reducing the effective damping impedance of the second amplifying device during switching segments of the timing pulse.

Figure 2:
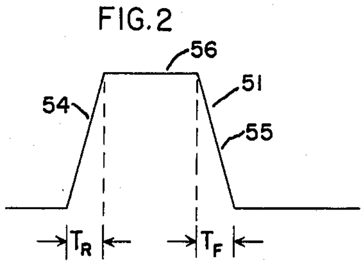

Further objects, features and the attending advantages of the invention will be apparent with reference to the following specification and the drawings in which:

FIGURE 1 is a circuit diagram partly in block form of a sinusoidal oscillator circuit arrangement embodying the present invention, and FIGURE 2 is a diagram illustrating the different segments of an electrical timing impulse.

For a detailed description of one embodiment of the present invention, reference is now made to FIGURE 1. A sine wave oscillator circuit arrangement is shown therein and includes an oscillator circuit comprising a first amplifying device 11, a frequency determining resonant circuit 12 having an inductance 13 and capacitance 14, and an RC grid-leak bias combination having a resistor 16 and a capacitor 17. The resonant circuit 12 is coupled by the capacitor 17, to a first control electrode 18 and by a direct-current connection to an anode electrode 19 of the amplifying device 11. A tap 20 on the inductance 13 is coupled for alternating currents to a second control electrode comprising a cathode electrode 21 by a capacitance 22, a degeneration resistive impedance 23 and a parasitic oscillation suppressor resistor 24. Direct-current operating potential $E_1$ for the device 11 is provided by a source 25 and is coupled to the anode electrode 19 via a voltage dropping resistor 26, and a portion of the winding of inductance 13 and to the cathode electrode 21 via a common ground connection and resistor 23 and resistor 24. The oscillator circuit as thus described is of the tuned plate feedback type. A balanced sinusoidal voltage 27 exists across the tuned circuit 12 and may be derived between a pair of output terminals 28 and 29.

The oscillator circuit arrangement includes means for suppressing the voltage 27 during the occurrence of an input timing pulse. The suppression means comprises a second amplifying device 30 having a control electrode 31 and first and second output electrodes comprising the anode and cathode electrodes 32 and 33 respectively. Anode electrode 32 is direct-current coupled to the anode electrode 19 of amplifying device 11 by a parasitic oscillation suppression resistor 34. The cathode electrode 33 is direct-current coupled to the cathode 21 by the resistor 24. The amplifying device 30 is biased in a state of low anode current conduction or anode current cut-off in the absence of timing pulses by a voltage which is direct-current coupled from a cathode follower circuit to the electrode 31.

The cathode follower circuit includes an amplifying device 40 having anode, cathode and control electrodes 41, 42 and 43 respectively. Anode voltage is supplied to the device 40 by the source 25 while a resistive cathode load impedance comprising a resistor 44 and a potentiometer 45 is coupled to a source of negative potential 46. A bias voltage is coupled from the junction of resistors 44 and 45 to control electrode 43 by a resistor 47. The voltage at this junction point is maintained substantially constant by a capacitor 48.

A source 50 of timing pulses 51 for causing periodic suppression of the generated sinusoidal oscillation 27 is provided. The timing pulses are coupled to the control electrode 43 by a capacitor 52. As indicated hereinbefore, the device 30 is maintained in a state of low anode current conduction or in a state of anode current cut-off by a negative bias voltage developed at the cathode 42 of the cathode follower. The amplifying device 30 represents a high impedance under these conditions and the oscillator circuit is free to oscillate and to generate the desired sinusoidal oscillations 27 during a period of time 53 which is intermediate the occurrence of the pulses 51. However, during the occurrence of the timing pulses 51, the voltage at the cathode 42 will follow the waveform of pulses 51 and the device 30 will consequently be driven into a state of heavy anode current conduction. During conduction, the serial combination of the device 30 with resistors 23 and 34 represents a low dissipative impedance to ground and damps oscillations in the tuned circuit 12. The conduction of the device 30 thus operates to suppress the oscillations 27.

As indicated hereinbefore, it is desirable in suppressing the oscillations that the suppression be initiated and terminated rapidly. Referring to FIGURE 2, the timing pulse 51 is shown enlarged in order to illustrate a leading switching segment 54 which occurs in a period of time $T_r$ corresponding to the initiation of suppression and a trailing switching segment 55 which occurs in a period of time $T_f$ corresponding to termination of suppression. A flat-top segment 56 of the pulse comprises the remaining segment of the pulse. It is desirable that the suppression of oscillations be substantially completed in the period $T_r$ and that the suppression be substantially terminated in the period $T_f$.

In accordance with a feature of the present invention, the oscillator circuit is arranged in a manner for providing a degenerative voltage at an electrode of the amplifying device 11 during the occurrence of the switching pulse 51. The degeneration resistor 23 is coupled in the cathode circuit of the device 11 and the amplifying device 30 is coupled to the resistor 23 and to the source 25 of direct-current potential in a manner for providing the direct-current degeneration. As the amplitude of the pulse 51 increases in accordance with the amplitude of the switching segment 54, an increasing current will flow through the device 30. This current will cause an increasing voltage drop across resistor 23. The voltage drop across resistor 23 is degenerative and reduces the transconductance of the device 11 thereby reducing current flow in the tuned circuit 12 and consequently reducing the time required to provide initiation and termination of suppression of the oscillations 27.

In accordance with another feature of the present invention, means are provided for causing the amplifying device 30 to provide a lower effective impedance for damping the circuit 12. A capacitor 56 is coupled between the control and anode electrodes 31 and 32. During the periods $T_r$ and $T_f$, this capacitor 56 provides negative shunt feedback at high frequencies thus lowering the effective dynamic impedance of the device 30 for damping the tuned circuit 12. The lowered damping impedance accordingly reduces the time required to provide initiation and termination of suppression. Thus, a sinusoidal oscillator circuit arrangement has been described in which the oscillations may be rapidly turned on and turned off in a shorter period of time than has heretofore been possible.

While it will be understood that the value of circuit components for the oscillator circuit arrangement of this invention may vary in order to satisfy individual requirements, the following circuit parameters have been found to provide satisfactory operation and are included herein along with magnitudes of pertinent voltages only by way of examples as follows:

Amplifying device:

| | |
|---|---|
| 11 | ½ 6CG7. |
| 30 | ½ 12AU7. |
| 40 | ½ 12AU7. |

| | |
|---|---|
| Voltage $E_1$ | 300 v. |
| Voltage $E_2$ | 150 v. |
| Inductance 13 | Bi-filar wound inductor, $L$=5–10 microhenry. |

Resistor:

| | |
|---|---|
| 16 | 18K ohm. |
| 23 | 100 ohm. |
| 24 | 47 ohm. |
| 26 | 4.7K ohm. |
| 34 | 47 ohm. |
| 44 | 22K ohm. |

| | |
|---|---|
| Resistor 47 | 100K ohm. |
| Potentiometer 45 | 50K ohm. max. |

Capacitor:

| | |
|---|---|
| 17 | 27 $\mu\mu$f. |
| 22 | .005 $\mu$f. |
| 48 | 25 $\mu$f. |
| 52 | .047 $\mu$f. |
| 56 | 22 $\mu\mu$f. |
| 14 | 8–50 $\mu$f. variable and adjusted for an oscillation frequency of 11 mc. |

While we have illustrated and described and have pointed out in the annexed claims certain novel features of our invention, it will be understood that various omissions, substitutions and changes in the forms and details of the system illustrated may be made by those skilled in the art without departing from the spirit of the invention and the scope of the claims.

What we claim as new and desire to secure by Letters Patent of the United States is:

1. Means for generating and for periodically suppressing a sinusoidal oscillation comprising: a first electron discharge amplifying device having anode, cathode and control electrodes; a parallel resonant circuit having tapped inductance and a capacitance tuned for a desired frequency of oscillation; a source of operating potential; means coupling said source of operating potential to the tap on said inductance; means direct-current coupling said resonant circuit to said anode electrode; means, including a grid-leak bias arrangement for coupling said resonant circuit to said control electrode; a parasitic suppression resistor and a degeneration resistor connected in series and having a junction; means connecting said parasitic suppression resistor to said cathode electrode; means coupling said degeneration resistor to said tap on said inductance for alternating currents and to said source of potential for direct-currents; a second amplifying device having anode, cathode, and control electrodes; a parasitic suppression resistor interconnecting said anode electrodes; means connecting said cathode electrode of said second device to said junction of said parasitic suppression and degeneration resistors; a capacitor connected between said anode and control electrodes of said second device; a source of periodic timing pulses; means coupling said timing pulses to said control electrode of said second device; said latter coupling means including a cathode follower circuit providing a direct-current output voltage for a period of time intermediate the occurrence of said timing pulses for maintaining said second amplifying device in a state of anode current cut-off.

2. An oscillator circuit arrangement comprising:

(a) oscillator means including a first electron discharge device having anode, cathode and grid electrodes, resonant circuit means connected between said anode and grid electrodes to establish oscillations at a prescribed frequency, impedance means comprising an unbypassed cathode resistor connected to said cathode to establish degenerative operation of said discharge device, (b) oscillation suppression means including a second electron discharge device having anode, cathode and grid electrodes, said anode of said second discharge device being connected to said resonant circuit means to cause damping of said oscillations when said second discharge device is conducting, said cathode of said second discharge device being connected to said resistor to increase degeneration when said second amplifying device is conducting, and (c) means for applying timing pulses to said grid electrode of said second discharge device to cause conduction thereof to simultaneously damp said oscillations and increase degeneration during the period of each pulse.

3. An oscillator circuit arrangement comprising:

(a) oscillator means including a first electron discharge device having anode, cathode and grid electrodes, inductance-capacitance circuit means connected between said anode and a reference point, said inductance-capacitance circuit means being resonant at a prescribed frequency, impedance means connected between said cathode and said reference point to establish degenerative operation of said first discharge device, said impedance means solely comprising first and second serially connected resistors, (b) oscillation suppressing means including a second electron discharge device having anode, cathode and grid electrodes, the anode of said second discharge device being D.C.-coupled to the anode of said first discharge device to cause damping of said oscillation when said second discharge device is conducting, said cathode of said second discharge device being D.C.-coupled to the junction between said first and second resistors to increase the current flowing through said second resistor when said second discharge device is conducting, and (c) means for applying timing pulses to said grid electrode of said second discharge device to cause conduction thereof to simultaneously damp said oscillations and increase degeneration during the period of each pulse.

4. An oscillator circuit arrangement comprising:

(a) oscillator means including a first electron discharge device having anode, cathode and grid electrodes, resonant circuit means connected between said anode and grid electrodes to establish oscillations at a prescribed frequency, impedance means connected to said cathode to establish degenerative operation of said discharge device, (b) oscillation suppression means including a second electron discharge device having anode, cathode and grid electrodes, said anode of said second discharge device being connected to said resonant circuit means to cause damping of said oscillations when said second discharge device is conducting, said cathode of said second discharge device being connected to said impedance means to increase degeneration when said second amplifying device is conducting, (c) means for applying timing pulses to said grid electrode of said second discharge device to cause conduction thereof to simultaneously damp said oscillations and increase degeneration during the period of each pulse, and (d) a capacitance connected between said grid and anode electrodes of said second discharge device to reduce the effective impedance of said second discharge device at the leading and trailing edges of each of said timing pulses.

References Cited by the Examiner

UNITED STATES PATENTS

| | | | |
|---|---|---|---|
| 2,638,548 | 5/1953 | MacNichol | 331—173 |
| 2,659,009 | 10/1953 | Emslie | 331—172 |
| 2,735,014 | 2/1956 | Rado | 331—173 |
| 2,900,505 | 8/1959 | Page | 331—173 |

ROY LAKE, *Primary Examiner.*

JOHN KOMINSKI, *Examiner.*